United States Patent
Kuo et al.

(10) Patent No.: US 9,093,605 B2
(45) Date of Patent: *Jul. 28, 2015

(54) OPTOELECTRONIC DEVICE AND METHOD FOR MANUFACTURING THE SAME

(71) Applicant: EPISTAR CORPORATION, Hsinchu (TW)

(72) Inventors: De Shan Kuo, Hsinchu (TW); Tsun Kai Ko, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/937,510

(22) Filed: Jul. 9, 2013

(65) Prior Publication Data
US 2013/0292720 A1    Nov. 7, 2013

Related U.S. Application Data

(63) Continuation of application No. 13/310,339, filed on Dec. 2, 2011, now Pat. No. 8,507,925.

(51) Int. Cl.
| | |
|---|---|
| *H01L 33/00* | (2010.01) |
| *H01L 33/30* | (2010.01) |
| *H01L 31/0352* | (2006.01) |
| *H01L 33/12* | (2010.01) |
| *H01L 33/10* | (2010.01) |
| *H01L 33/14* | (2010.01) |
| *H01L 51/52* | (2006.01) |

(52) U.S. Cl.
CPC ........ *H01L 33/30* (2013.01); *H01L 31/035227* (2013.01); *H01L 33/007* (2013.01); *H01L 33/0062* (2013.01); *H01L 33/12* (2013.01); *H01L 33/10* (2013.01); *H01L 33/145* (2013.01); *H01L 51/5275* (2013.01); *H01S 2304/12* (2013.01)

(58) Field of Classification Search
CPC ....... H01L 33/007; H01L 33/10; H01L 33/12; H01L 33/30; H01L 33/0062; H01L 33/145; H01L 31/035227
USPC ................................. 257/94; 438/47
See application file for complete search history.

(56) References Cited

U.S. PATENT DOCUMENTS

| 6,911,351 B2 * | 6/2005 | Kidoguchi et al. ............. 438/46 |
| 8,507,925 B2 * | 8/2013 | Kuo et al. ........................ 257/79 |
| 2003/0183827 A1 * | 10/2003 | Kawaguchi et al. ............ 257/79 |

(Continued)

FOREIGN PATENT DOCUMENTS

| CN | 1441982 A | 9/2003 |
| CN | 1653624 A | 8/2005 |

(Continued)

*Primary Examiner* — Trung Q Dang
(74) *Attorney, Agent, or Firm* — Ditthavong & Steiner, P.C.

(57) ABSTRACT

An optoelectronic device comprises: a substrate having a first surface and a normal direction perpendicular to the first surface; a first semiconductor formed on the first surface of the substrate, comprising a plurality of hollow components formed in the first semiconductor layer; a first protection layer formed on a sidewall and a bottom wall of the plurality of the hollow components, and the bottom wall comprises a portion of the first surface; and a buffer layer formed on the first semiconductor layer wherein the buffer layer comprises a first surface and a second surface opposite to the first surface.

18 Claims, 7 Drawing Sheets

(56) References Cited

U.S. PATENT DOCUMENTS

| | | |
|---|---|---|
| 2006/0060866 A1 | 3/2006 | Tezen |
| 2007/0041214 A1 | 2/2007 | Ha et al. |
| 2007/0259464 A1 | 11/2007 | Bour et al. |
| 2009/0127567 A1 | 5/2009 | Wang |
| 2009/0261474 A1* | 10/2009 | Chung et al. .................. 257/738 |
| 2010/0032647 A1* | 2/2010 | Khan et al. ...................... 257/13 |
| 2010/0133505 A1* | 6/2010 | Takao et al. ..................... 257/13 |
| 2010/0237357 A1 | 9/2010 | Tsai et al. |
| 2011/0042718 A1* | 2/2011 | Wang et al. .................... 257/190 |
| 2011/0163295 A1* | 7/2011 | Wu et al. ......................... 257/13 |
| 2011/0315996 A1 | 12/2011 | Kim et al. |
| 2012/0068214 A1 | 3/2012 | Kuo et al. |
| 2014/0027806 A1* | 1/2014 | Huang et al. .................... 257/98 |

FOREIGN PATENT DOCUMENTS

| | | |
|---|---|---|
| CN | 1945864 A | 4/2007 |
| CN | 101409229 A | 4/2009 |
| JP | 11145516 H | 5/1999 |
| JP | 2002-217115 A | 8/2002 |
| JP | 2004-055864 A | 2/2004 |
| JP | 2007-260952 A | 10/2007 |
| KR | 20080100706 A | 11/2008 |

* cited by examiner

OPTOELECTRONIC DEVICE AND METHOD FOR MANUFACTURING THE SAME

RELATED APPLICATION

This application is a continuation application of U.S. patent application Ser. No. 13/310,339, entitled "OPTOELECTRONIC DEVICE AND METHOD FOR MANUFACTURING THE SAME", filed Dec. 2, 2011, now pending, the entire content of which is incorporated herein by reference in its entirety.

BACKGROUND

1. Technical Field

The present disclosure relates to an optoelectronic device having a hollow component formed inside the semiconductor layer.

2. Description of the Related Art

The light radiation theory of light emitting diode (LED) is to generate light from the energy released by the electron moving between the n-type semiconductor and the p-type semiconductor. Because the light radiation theory of LED is different from the incandescent light which heats the filament, the LED is called a "cold" light source.

Moreover, the LED is more sustainable, longevous, light and handy, and less power consumption, therefore it is considered as a new light source for the illumination markets. The LED applies to various applications like the traffic signal, backlight module, street light, and medical instruments, and is gradually replacing the traditional lighting sources.

SUMMARY OF THE DISCLOSURE

An optoelectronic device, comprises: a substrate having a first surface and a normal direction perpendicular to the first surface; a plurality of the first semiconductor rods formed on the first surface of the substrate, contacted with the substrate, and exposed partial of the first surface of the substrate; a first protection layer formed on the sidewall of the plurality of the first semiconductor rods and the exposed partial of the first surface of the substrate; a first buffer layer formed on the plurality of the first semiconductor rods wherein the first buffer layer having a first surface and a second surface opposite to the first surface, and the plurality of the first semiconductor rods directly contacted with the first surface; and at least one first hollow component formed among the first semiconductor rods, the first surface of the substrate, and the first surface of the first buffer layer, wherein the width of the first hollow component is further defined as the largest size of the first hollow component perpendicular to the normal direction of the substrate and the height of the first hollow component is further defined as the largest size of the first hollow component parallel with the normal direction of the substrate and the ratio of the height and the width of the first hollow component is 1/5-3.

An optoelectronic device, comprises: a substrate having a first surface and a normal direction perpendicular to the first surface; a first semiconductor formed on the first surface of the substrate, comprising a plurality of hollow components formed in the first semiconductor layer; a first protection layer formed on a sidewall and a bottom wall of the plurality of the hollow components, and the bottom wall comprises a portion of the first surface; and a buffer layer formed on the first semiconductor layer wherein the buffer layer comprises a first surface and a second surface opposite to the first surface.

A method of fabricating an optoelectronic device comprises: providing a substrate having a first surface and a normal direction perpendicular to the first surface; forming a first semiconductor layer on the first surface of the substrate; forming a plurality of hollow components by patterning the first semiconductor layer; providing a first protection layer to cover on a sidewall of the plurality of the hollow components; and forming a buffer layer on the first semiconductor layer wherein the buffer layer comprise a first surface and a second surface opposite to the first surface; wherein the method of patterning the first semiconductor layer comprises: forming an anti-etching layer on the first semiconductor layer; forming a thin-film metal layer on the anti-etching layer; forming a plurality of nanoscale metal particles by treating the thin-film metal layer with thermal treatment; using the plurality of nanoscale metal particles as a mask to pattern the anti-etching layer by anisotropic etching method; removing the plurality of nanoscale metal particles; and using the patterned anti-etching layer as a mask to anisotropically etch the first semiconductor layer.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
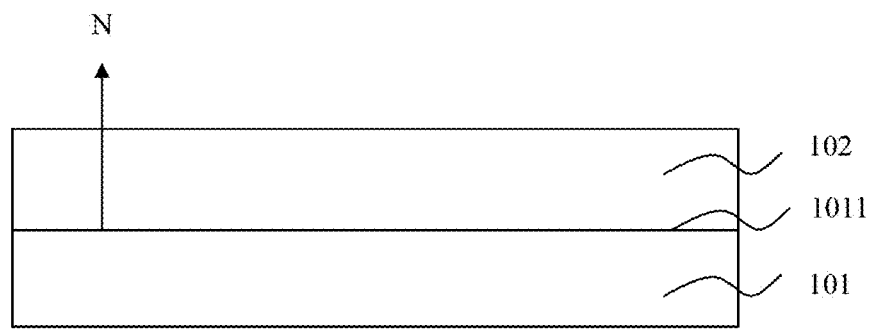
FIGS. 1A-1D, 1F-1G illustrate a process flow of a method of fabricating an optoelectronic device of the embodiment in the present application.

Reference is made in detail to the preferred embodiments of the present application, examples of which are illustrated in the accompanying drawings. Wherever possible, the same reference numbers are used in the drawings and the description to refer to the same or like parts.

The present application describes an optoelectronic device and a method of fabricating the optoelectronic device. In order to have a thorough understanding of the present application, please refer to the following description and the illustrations.

FIGS. 1A to 1G illustrate a process flow of the method of fabricating the optoelectronic device of the first embodiment of the present application. FIG. 1A shows a substrate 101 having a normal direction N of a first surface 1011. A first semiconductor layer 102 is formed on the first surface 1011 of the substrate 101.

Figure 1B:
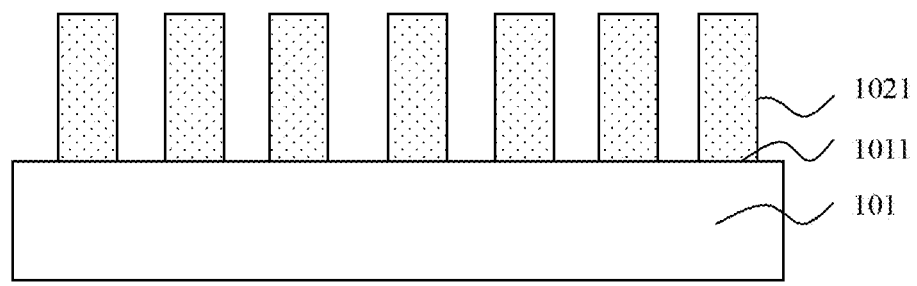

As FIG. 1B shows, the first semiconductor layer 102 is etched to form a plurality of the first semiconductor rods 1021 on the first surface 1011 of the substrate 101. In one embodiment, the first semiconductor layer 102 is etched to form at least one hollow component such as pore, void, bore, pinhole, and cavity by the etching process of electrochemical etching; anisotropic etching like dry etching such as inductively-coupled plasma reactive ion etching (ICP-RIE); wet etching with an aqueous solution of at least one of $H_2SO_4$, $H_3PO_4$, $H_2C_2O_4$, HCl, KOH, and NaOH, ethylene glycol solution, or their mixture. In one embodiment, at least two hollow components can link into a mesh or porous structure. One method for manufacturing the hollow component is described for instance in U.S. patent application Ser. No. 13/235,797, and the disclosure content of which in this respect is hereby incorporated by reference in its entirety.

Figure 1C:
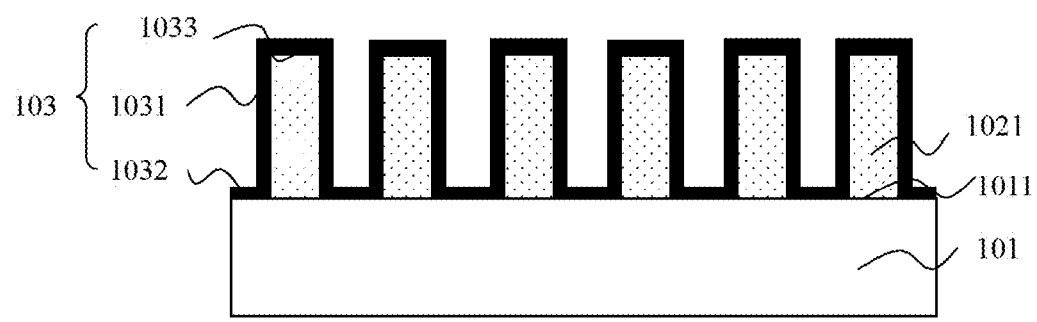

Following, as FIG. 1C shows, a protection layer 103 is formed on the surface of the first semiconductor rod 1021 and the exposed surface of the substrate including a first protection layer 1031 formed on the sidewall of the first semiconductor rod 1021, a second protection layer 1032 formed on the exposed surface of the substrate 1011 and a third protection layer 1033 formed on the top surface of the first semiconductor rod 1021. In one embodiment, the protection layer 103 is formed by the method of spin on glass coating (SOG), and the material of the protection layer 103 can be $SiO_2$, HSQ (Hydrogen silesquioxane), MSQ (Methylsequioxane), and Polymer of silsequioxane.

Following, a first buffer layer 105 is formed after removing the third protection layer 1033 wherein the first buffer layer 105 is grown on the top of the plurality of the first semiconductor rods 1021 by Epitaxial Lateral Overgrowth (ELOG) method. As FIG. 1C shows, when growing the first buffer layer 105, at least one first hollow component 104 is formed among the two adjacent first semiconductor rods 1021, the substrate 101, and the first buffer layer 105. In this embodiment, by using the first protection layer 1031 to cover the sidewall of the first semiconductor rod 1021, the preference of the growth direction is controlled. In one embodiment of this application, the first semiconductor layer 102 or the first buffer layer 105 can be an unintentional doped layer, an undoped layer or an n-type doped layer.

Figure 1D:
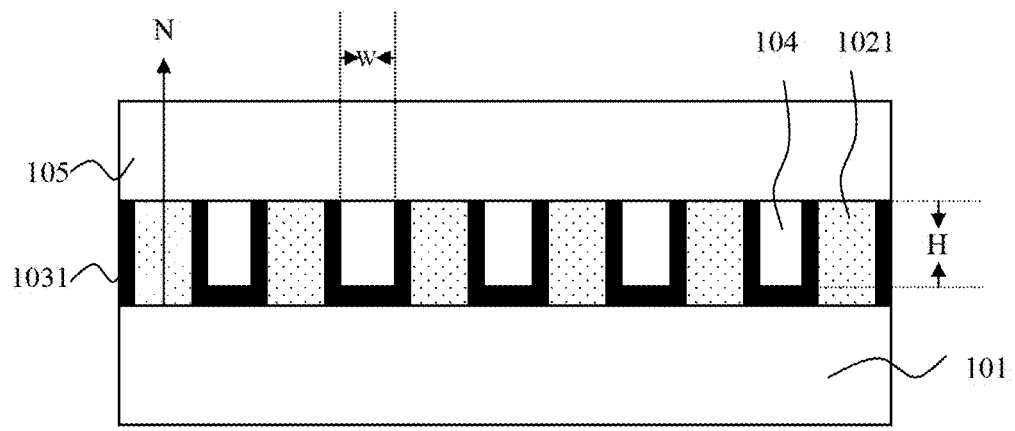
Figure 1E:
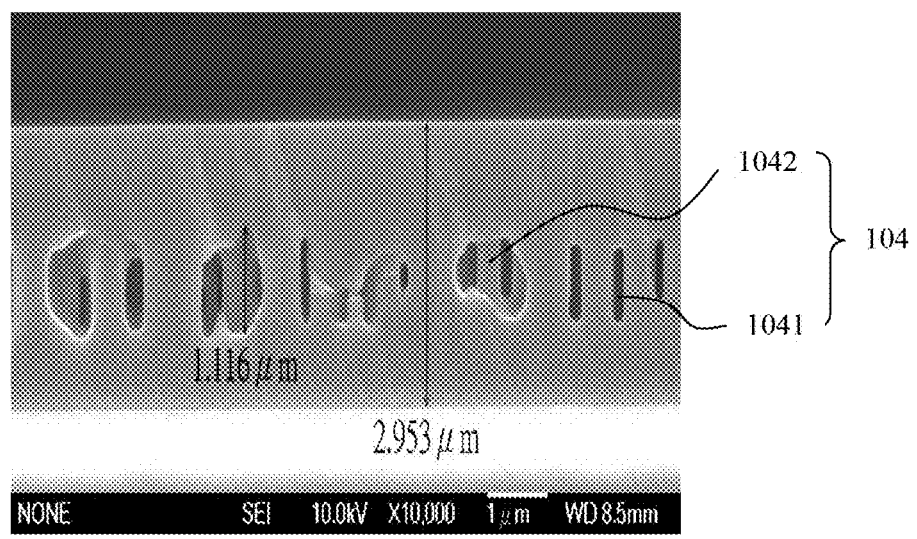
FIG. 1E illustrates scanning electron microscope (SEM) picture of the embodiment in the present application.

FIG. 1E illustrates scanning electron microscope (SEM) pictures of the first hollow component 104 of the embodiment of the present disclosure. As FIG. 1E shows, the first hollow component 104 can be an independent hollow component 1041 such as pore, void, bore, pinhole, and cavity; or at least two first hollow components 104 can link into a mesh or porous structure 1042.

As FIG. 1D shows, the cross-sectional view of the first hollow component 104 projected completely on the normal direction N of the substrate 101 having a width W and a height H that the width W of the first hollow component 104 is defined as the largest size of the first hollow component 104 perpendicular to the normal direction N of the substrate 101 and the height H of the first hollow component 104 is defined as the largest size of the first hollow component 104 parallel with the normal direction N of the substrate 101. The width W of the first hollow component 104 can be 50 nm-600 nm, 50 nm-500 nm, 50 nm-400 nm, 50 nm-300 nm, 50 nm-200 nm, or 50 nm-100 nm. The height H of the first hollow component 104 can be 0.5 µm-2 µm, 0.5 µm-1.8 µm, 0.5 µm-1.6 µm, 0.5 µm-1.4 µm, 0.5 µm-1.2 µm, 0.5 µm-1 µm, or 0.5 µm-0.8 µm. In another embodiment of this application, the ratio of the height H and the width W of the first hollow component 104 can be 1/5-3, 1/5-2, 1/5-1, 1/5-1/2, 1/5-1/3, or 1/5-1/4.

In one embodiment, a plurality of first hollow components 104 can be formed between the two adjacent first semiconductor rods 1022 and the substrate 101. In another embodiment, because the plurality of the first semiconductor rods 1022 can be a regular array structure, the plurality of the first hollow component 104 can be a regular array structure accordingly.

The average width $W_x$ of the plurality of the first hollow components 104 can be 50 nm-600 nm, 50 nm-500 nm, 50 nm-400 nm, 50 nm-300 nm, 50 nm-200 nm, or 50 nm-100 nm. The average height $H_x$ of the plurality of the first hollow components 104 can be 0.5 µm-2 µm, 0.5 µm-1.8 µm, 0.5 µm-1.6 µm, 0.5 µm-1.4 µm, 0.5 µm-1.2 µm, 0.5 µm-1 µm, or 0.5 µm-0.8 µm. In one embodiment, the average distance of the plurality of the first hollow components 104 can be 10 nm-1.5 µm, 30 nm-1.5 µm, 50 nm-1.5 µm, 80 nm-1.5 µm, 1 µm-1.5 µm, or 1.2 µm-1.5 µm. In another embodiment of this application, the ratio of the average height $H_x$ and the average width $W_x$ of the plurality of the first hollow components 104 can be 1/5-3, 1/5-2, 1/5-1, 1/5-1/2, 1/5-1/3, or 1/5-1/4.

The porosity φ of the plurality of the first hollow components 104 is defined as the total volume of the plurality of the first hollow components $V_v$ divided by the overall volume $V_T$ of the total volume of the plurality of the first hollow components 104 and the first semiconductor layer 102

$$\left(\phi = \frac{V_V}{V_T}\right).$$

In this embodiment, the porosity φ can be 5%-90%, 10%-90%, 20%-90%, 30%-90%, 40%-90%, 50%-90%, 60%-90%, 70%-90%, or 80%-90%.

Figure 1F:
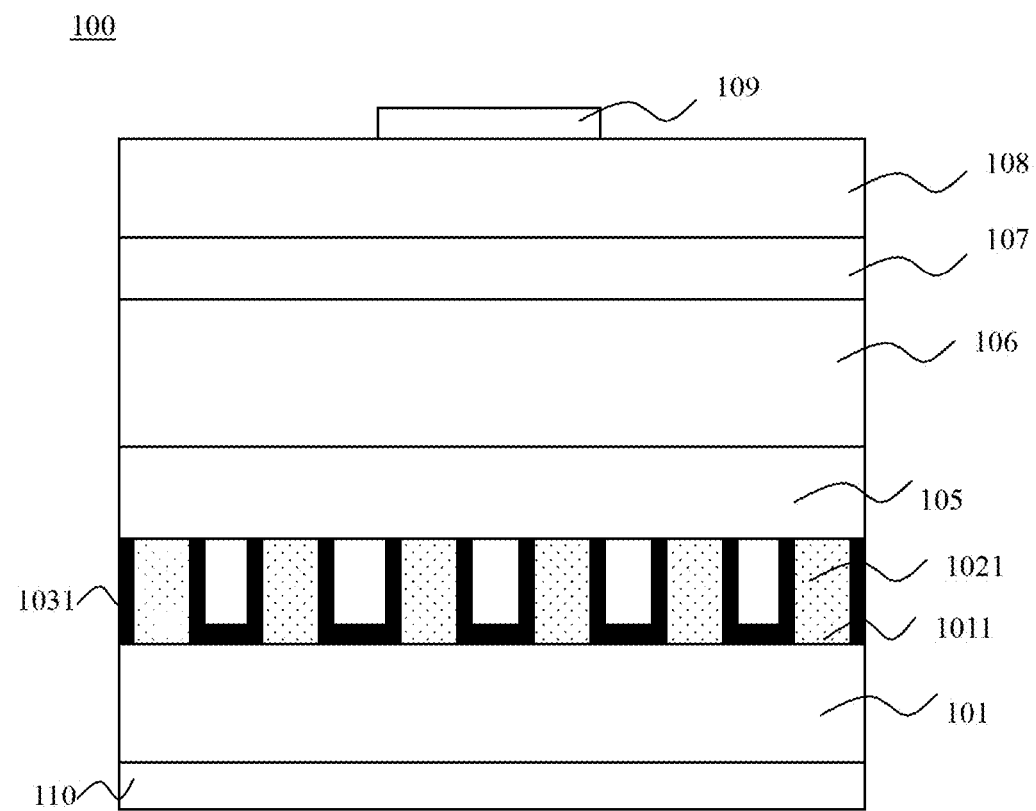

Following, as FIG. 1F shows, a second semiconductor layer 106, an active layer 107, and a third semiconductor layer 108 are formed on the first buffer layer 105 subsequently.

Finally, as shown in FIG. 1F, two electrodes 109, 110 are formed on the third semiconductor layer 108 and the substrate 101 respectively to form a vertical type optoelectronic device 100.

Figure 1G:
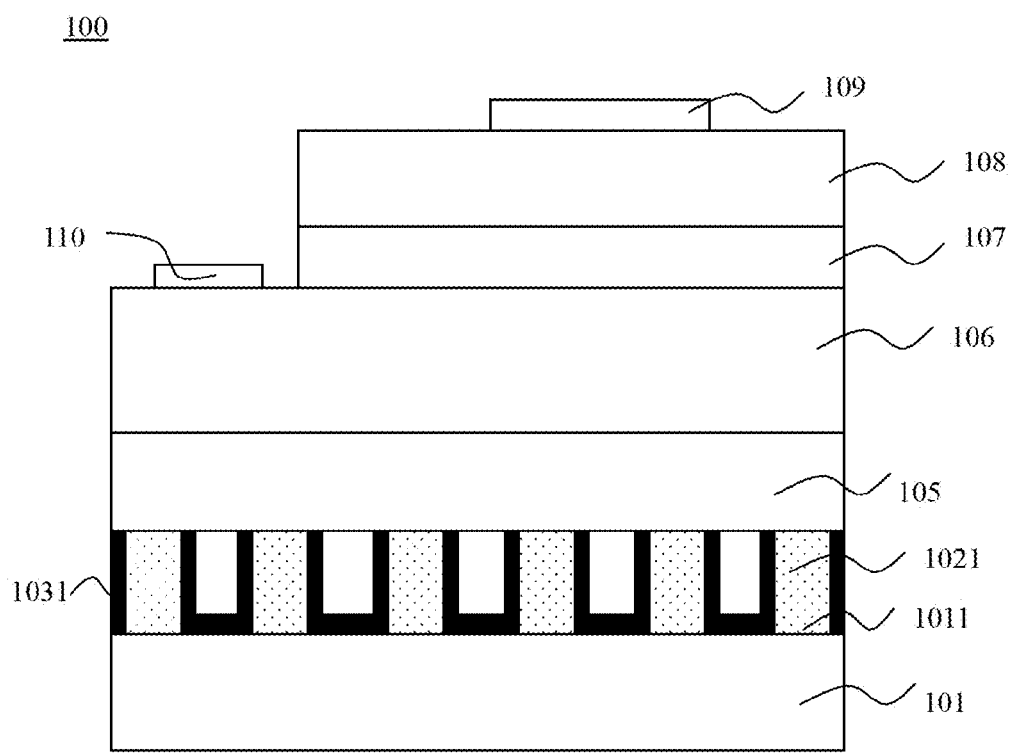

In one embodiment, as shown in FIG. 1G, partial of the active layer 107 and the third semiconductor layer 108 are etched to expose partial of the second semiconductor layer 106. Two electrodes 109, 110 are formed on the third semiconductor layer 108 and the second semiconductor layer 106 respectively to form a horizontal type optoelectronic device 100'. The material of the electrode 109, 110 can be Cr, Ti, Ni, Pt, Cu, Au, Al, or Ag.

In one embodiment, the optoelectronic device 100' can be bonded to a submount to form a flip-chip structure.

Each of the first hollow components 104 formed among the plurality of the first semiconductor rods 1022, the first buffer layer 105 and the substrate 101 has a refractive index. Because of the difference of the refractive indexes of the first hollow component 104 and the first buffer layer 105, for example, the refractive index of the first buffer layer 105 is 2-3, and the refractive index of air is 1 so the light transmitting into the first hollow component 104 changes its emitting direction to outside the optoelectronic device and increases the light emitting efficiency. Besides, the first hollow component 104 can be a scattering center to change the direction of the photon and decrease the total reflection. By increasing the porosity of the first hollow component 104, the effect mentioned above is increasing.

Specifically speaking, the optoelectronic device 100, 100' can be a light-emitting diode (LED), a laser diode (LD), a photoresister, an infrared emitter, an organic light-emitting diode, a liquid crystal display, a solar cell, or a photo diode.

The material of the substrate 101 can be a conductive substrate, a non-conductive substrate, transparent or non-transparent substrate. The material of the conductive substrate can be metal such as germanium (Ge), or gallium arsenide (GaAs), indium phosphide (InP), silicon carbide (SiC), silicon (Si), gallium nitride (GaN), or aluminum nitride (AlN). The transparent substrate can be sapphire, lithium aluminum oxide (LiAlO$_2$), zinc oxide (ZnO), gallium nitride (GaN), aluminum nitride (AlN), glass, diamond, CVD diamond, diamond-like carbon (DLC), spinel (MgAl$_2$O$_4$), aluminum oxide (Al$_2$O$_3$), silicon oxide (SiO$_x$), and Lithium Dioxogallate (LiGaO$_2$).

In accordance with the embodiments in the application, the second semiconductor layer 106 and the third semiconductor layer 108 are two single-layer structures or two multiple layers structure ("multiple layers" means two or more than two layers) having different electrical properties, polarities, dopants for providing electrons or holes respectively. If the second semiconductor layer 106 and the third semiconductor layer 108 are composed of the semiconductor materials, the conductivity type can be any two of p-type, n-type, and i-type. The active layer 107 disposed between the second semiconductor layer 106 and the third semiconductor layer 108 is a region where the light energy and the electrical energy could transfer or could be induced to transfer. The device transferring the electrical energy to the light energy can be a light-emitting diode, a liquid crystal display, or an organic light-emitting diode; the device transferring the light energy to the electrical energy can be a solar cell or an optoelectronic diode.

In another embodiment of this application, the optoelectronic devices 100, 100' are light emitting devices. The light emission spectrum after transformation can be adjusted by changing the physical or chemical arrangement of one layer or more layers in the semiconductor system. The material of the semiconductor layer can be AlGaInP, AlGaInN, or ZnO. The structure of the active layer 107 can be a single heterostructure (SH), a double heterostructure (DH), a double-side double heterostructure (DDH), or a multi-quantum well (MQW) structure. Besides, the wavelength of the emitted light could also be adjusted by changing the number of the pairs of the quantum well in a MQW structure.

In one embodiment of this application, a buffer layer (not shown) could be optionally formed between the substrate 101 and the first semiconductor layer 102. The buffer layer between two material systems can be used as a buffer system. For the structure of the light-emitting diode, the buffer layer is used to reduce the lattice mismatch between two material systems. On the other hand, the buffer layer could also be a single layer, multiple layers, or a structure to combine two materials or two separated structures where the material of the buffer layer can be organic, inorganic, metal, semiconductor, and so on, and the function of the buffer layer can be as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on. The material of the buffer layer can be AlN, GaN, or other suitable materials. The fabricating method of the buffer layer can be sputter or atomic layer deposition (ALD).

A contact layer (not shown) can also be optionally formed on the third semiconductor layer 108. The contact layer is disposed on the side of the third semiconductor layer 108 away from the active layer 107. Specifically speaking, the contact layer could be an optical layer, an electrical layer, or the combination of the two. An optical layer can change the electromagnetic radiation or the light from or entering the active layer 107. The term "change" here means to change at least one optical property of the electromagnetic radiation or the light. The abovementioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 μm-0.6 μm.

Figure 2:
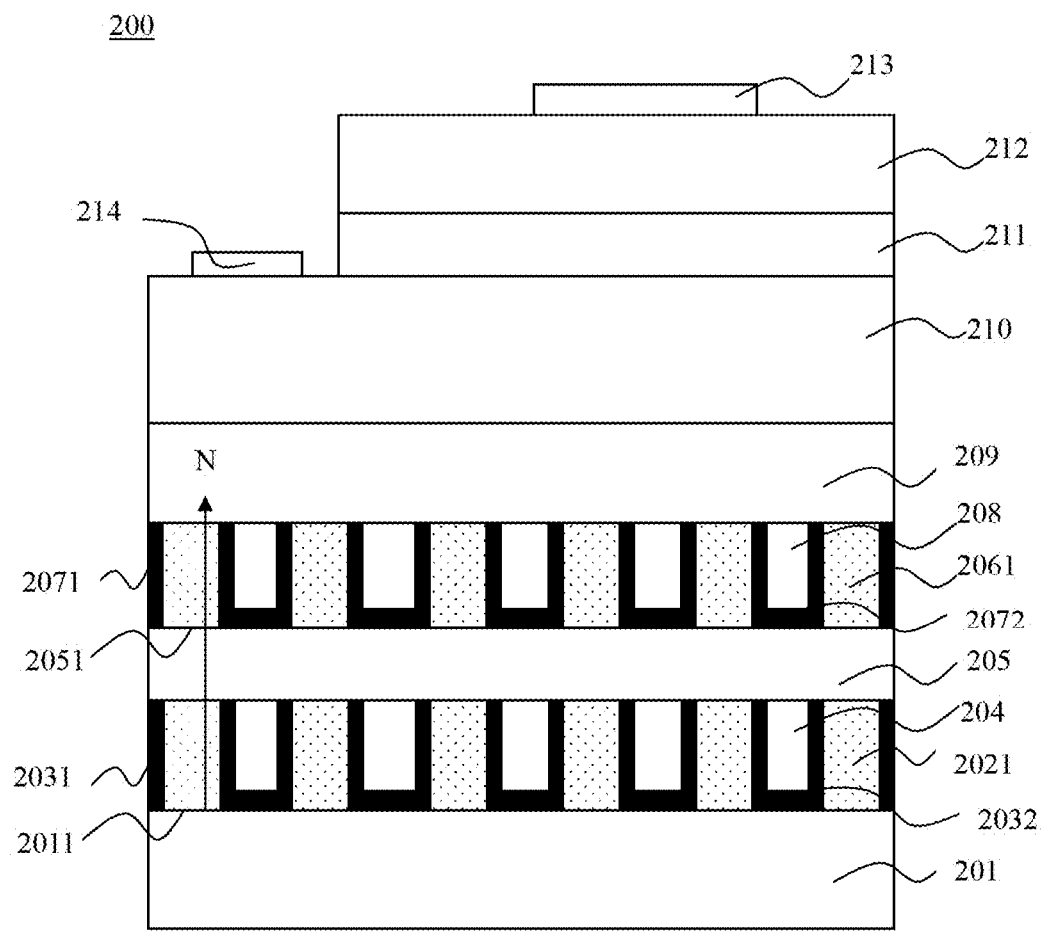
FIG. 2 illustrates the cross-sectional view of the structure of the embodiment in the present application.

FIG. 2 illustrates the cross-sectional view of the structure of another embodiment in the present application. The fabricating process of this embodiment is substantially the same with the first embodiment. In this embodiment, a substrate 201 is provided, and a plurality of the first semiconductor rods 2021 is formed on the substrate 201. A first protection layer 2031 is formed on the sidewall of the first semiconductor rod 2021 and a second protection layer 2032 is formed on the exposed surface 2011 of the substrate 201. In one embodiment, the first protection layer 2031 and the second protection layer 2032 are formed by the method of spin on glass coating (SOG); and the material of the first protection layer 2031 and the second protection layer 2032 can be SiO$_2$, HSQ (Hydrogen silesquioxane), MSQ (Methylsequioxane), and Polymer of silsequioxane.

Following, a first buffer layer 205 is grown on the top of the plurality of the first semiconductor rods 2021 by Epitaxial Lateral Overgrowth (ELOG) method. When growing the first buffer layer 205, at least one first hollow component 204 is formed among the two adjacent first semiconductor rods 2021, the substrate 201, and the first buffer layer 205. In this embodiment, by using the first protection layer 2031 to cover the sidewall of the first semiconductor rod 2021, the preference of the growth direction is controlled. In one embodiment of this application, the first semiconductor layer 202, or the first buffer layer 205 can be an unintentional doped layer, an undoped layer, or an n-type doped layer.

Following, a plurality of the second semiconductor rods 2061 is formed on the first buffer layer 205. A third protection layer 2071 is formed on the sidewall of the second semiconductor rod 2061 and a fourth protection layer 2072 is formed on the exposed surface of the first buffer layer 205. In one embodiment, the third protection layer 2071 and the fourth protection layer 2072 are formed by the method of spin on glass coating (SOG); and the material of the third protection layer 2071 and the fourth protection layer 2072 can be SiO$_2$, HSQ (Hydrogen silesquioxane), MSQ (Methylsequioxane), and Polymer of silsequioxane.

Following, a second buffer layer 209 is grown on the top of the plurality of the second semiconductor rods 2061 by Epitaxial Lateral Overgrowth (ELOG) method. When growing the second buffer layer 209, at least one second hollow component 208 is formed among the two adjacent second semiconductor rods 2061, the first buffer layer 205, and the second buffer layer 209. In this embodiment, by using the third protection layer 2071 to cover the sidewall of the second semiconductor rod 2061, the preference of the growth direction is controlled. In one embodiment of this application, the second buffer layer 209 can be an unintentional doped layer, an undoped layer, or an n-type doped layer.

The cross-sectional view of the first hollow component 204 and the second hollow component 208 can be projected completely on the normal direction N of the substrate 201 having a width W and a height H that the width W of the first hollow component 204 and the second hollow component 208 is defined as the largest size of the first hollow component 204 and the second hollow component 208 perpendicular to the normal direction N of the substrate 201 and the height H of the first hollow component 204 and the second hollow component 208 is defined as the largest size of the first hollow component 204 and the second hollow component 208 parallel with the normal direction N of the substrate 201. The width W of the first hollow component 204 and the second hollow component 208 can be 50 nm-600 nm, 50 nm-500 nm, 50 nm-400 nm, 50 nm-300 nm, 50 nm-200 nm, or 50 nm-100 nm. The height H of the first hollow component 204 and the second hollow component 208 can be 0.5 μm-2 μm, 0.5 μm-1.8 μm, 0.5 μm-1.6 μm, 0.5 μm-1.4 μm, 0.5 μm-1.2 μm, 0.5 μm-1 μm, or 0.5 μm-0.8 μm. In another embodiment of this application, the ratio of the height H and the width W of the first hollow component 204 and the second hollow component 208 can be 1/5-3, 1/5-2, 1/5-1, 1/5-1/2, 1/5-1/3, or 1/5-1/4.

In one embodiment, the volume of the first hollow component 204 is substantially the same with the second hollow component 208. In another embodiment, the volume of the first hollow component 204 is larger than that of the second hollow component 208.

In one embodiment, a plurality of first hollow components 204 can be formed between the two adjacent first semiconductor rods 2021 and the substrate 201. In another embodiment, because the plurality of the first semiconductor rods 2022 can be a regular array structure, the plurality of the first hollow components 204 can be a regular array structure accordingly.

The average width $W_x$ of the plurality of the first hollow components 204 can be 50 nm-600 nm, 50 nm-500 nm, 50 nm-400 nm, 50 nm-300 nm, 50 nm-200 nm, or 50 nm-100 nm. The average height $H_x$ of the plurality of the first hollow components 204 can be 0.5 μm-2 μm, 0.5 μm-1.6 μm, 0.5 μm-1.4 μm, 0.5 μm-1.2 μm, 0.5 μm-1 μm, or 0.5 μm-0.8 μm. In one embodiment, the average distance of the plurality of the first hollow components 204 can be 10 nm-1.5 μm, 30 nm-1.5 μm, 50 nm-1.5 μm, 80 nm-1.5 μm, 1 μm-1.5 μm, or 1.2 μm-1.5 μm. In another embodiment of this application, the ratio of the average height $H_x$ and the average width $W_x$ of the plurality of the first hollow components 204 can be 1/5-3, 1/5-2, 1/5-1, 1/5-1/2, 1/5-1/3, or 1/5-1/4.

The porosity φ of the plurality of the first hollow components 204 is defined as the total volume of the plurality of the first hollow components $V_v$ divided by the overall volume $V_T$ of the total volume of the plurality of the first hollow components 204 and the first semiconductor rods 2021

$$\left(\phi = \frac{V_V}{V_T}\right).$$

In this embodiment, the porosity φ can be 5%-90%, 10%-90%, 20%-90%, 30%-90%, 40%-90%, 50%-90%, 60%-90%, 70%-90%, or 80%-90%.

In one embodiment, a plurality of second hollow components 208 can be formed between the two adjacent second semiconductor rods 2061 and the second buffer layer 205. In another embodiment, because the plurality of the second semiconductor rods 2061 can be a regular array structure, the plurality of the second hollow components 208 can be a regular array structure accordingly.

The average width $W_x$ of the plurality of the second hollow components 208 can be 50 nm-600 nm, 50 nm-500 nm, 50 nm-400 nm, 50 nm-300 nm, 50 nm-200 nm, or 50 nm-100 nm. The average height $H_x$ of the plurality of the second hollow components 208 can be 0.5 μm-2 μm, 0.5 μm-1.8 μm, 0.5 μm-1.6 μm, 0.5 μm-1.4 μm, 0.5 μm-1.2 μm, 0.5 μm-1 μm, or 0.5 μm-0.8 μm. In one embodiment, the average distance of the plurality of the second hollow components 208 can be 10 nm-1.5 μm, 30 nm-1.5 μm, 50 nm-1.5 μm, 80 nm-1.5 μm, 1 μm-1.5 μm, or 1.2 μm-1.5 μm. In another embodiment of this application, the ratio of the average height $H_x$ and the average width $W_x$ of the plurality of the second hollow components 208 can be 1/5-3, 1/5-2, 1/5-1, 1/5-1/2, 1/5-1/3, or 1/5-1/4.

The porosity φ of the plurality of the second hollow components 208 is defined as the total volume of the plurality of the second hollow components $V_v$ divided by the overall volume $V_T$ of the total volume of the plurality of the second hollow components 208 and the second semiconductor rods 2061

$$\left(\phi = \frac{V_V}{V_T}\right).$$

In this embodiment, the porosity φ can be 5%-90%, 10%-90%, 20%-90%, 30%-90%, 40%-90%, 50%-90%, 60%-90%, 70%-90%, or 80%-90%.

Following, a third semiconductor layer 210, an active layer 211, and a fourth semiconductor layer 212 are formed on the second buffer layer 209 subsequently and partial of the active layer 211 and the fourth semiconductor layer 212 are etched to expose partial of the third semiconductor layer 210. Two electrodes 213, 214 are formed on the third semiconductor layer 210 and the fourth semiconductor layer 212 respectively to form a horizontal type optoelectronic device 200. The material of the electrodes 213, 214 can be Cr, Ti, Ni, Pt, Cu, Au, Al, or Ag.

In one embodiment, the optoelectronic device 200 can be bonded to a submount to form a flip-chip structure.

Each of the first hollow component 204 and the second hollow component 208 has a refractive index. When the light transmitting into the first hollow component 204 or the second hollow component 208, it can change its emitting direction to outside the optoelectronic device and increases the light emitting efficiency. Besides, the first hollow component 204 and the second hollow component 208 can be a scattering center to change the direction of the photon and decrease the total reflection. By increasing the porosity of the first hollow component 204 and the second hollow component 208, the effect mentioned above is increased.

In another embodiment, a third semiconductor rods (not shown) and a third buffer layer (not shown) can be optionally formed on the second buffer layer 209 and the third semiconductor layer 210 by the same fabricating process and at least one third hollow component (not shown) is formed between the second buffer layer 209 and the third semiconductor rods (not shown) to further increases the light emitting efficiency. In one embodiment, the volume of the first hollow component 204, the second hollow component 208 and third hollow component (not shown) is substantially the same. In another embodiment, the volume of the first hollow component 204 is larger than the second hollow component 208 and the volume of the second hollow component 208 is larger than that of the third hollow component (not shown).

In another embodiment, at least one fourth hollow component (not shown), one fifth hollow component (not shown)

can be formed by the same fabricating process, and the volume of the hollow components can be decreased subsequently from the first hollow component to the fifth hollow component.

Figure 3A:
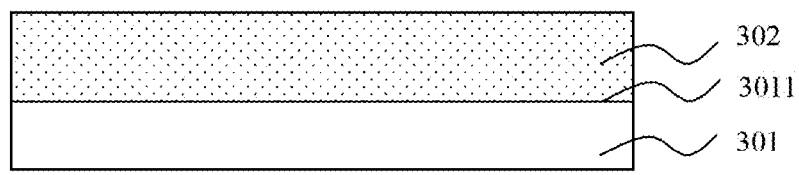
FIGS. 3A to 3F illustrate a process flow of a method of fabricating an optoelectronic device of another embodiment in the present application.
Figure 3B:
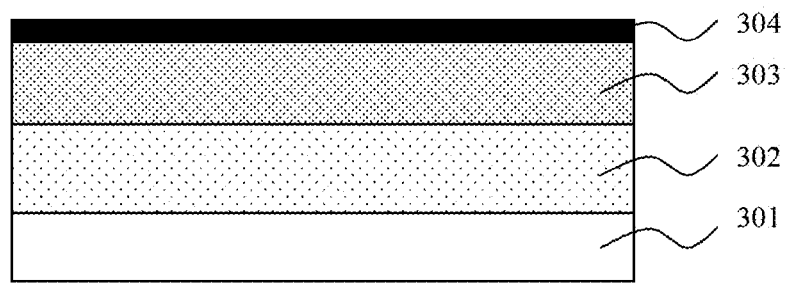

FIGS. 3A-3F schematically illustrate a fabricating process of etching the first semiconductor layer 102 into the plurality of the first semiconductor rods 1021 in the first embodiment of this application. As FIG. 3A shows, a first semiconductor layer 302 is formed on the first surface 3011 of the substrate 301. As FIG. 3B shows, an anti-etching layer 303 is formed on the first semiconductor layer 302, and the material of the anti-etching layer 303 can be $SiO_2$. A thin-film metal layer 304 can be formed on the anti-etching layer 303, and the material of the thin-film metal layer 304 can be nickel or aluminum, and the thickness of the thin-film metal layer 304 can be 500 nm-2000 nm.

Figure 3C:
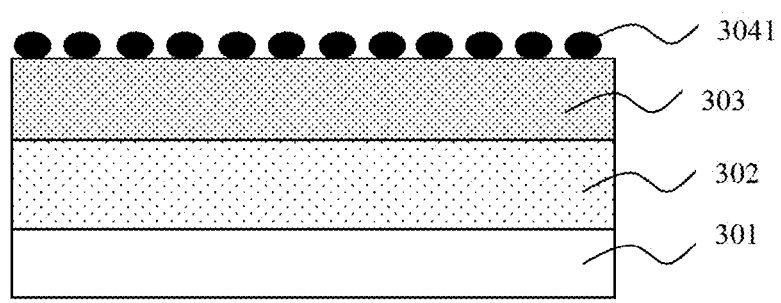

Following, as FIG. 3C shows, a thermal treatment is performed on the thin-film metal layer 304 wherein the temperature of the thermal treatment can be 750-900° C. By the thermal treatment, the thin-film metal layer can be formed into a plurality of nanoscale metal particles 3041 in a regular or nonregular distribution.

Figure 3D:
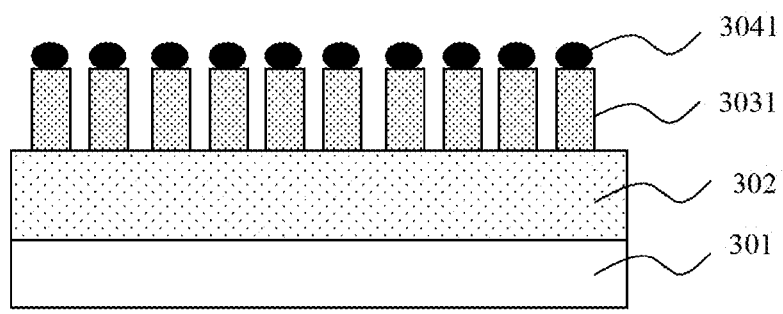

As FIG. 3D shows, the plurality of nanoscale metal particles 3041 is used as a mask and the anti-etching layer 303 can be formed into a plurality of the patterned anti-etching rods 3031 by photolithography method like inductively-coupled plasma reactive ion etching (ICP-RIE). In one embodiment of this application, the plurality of the patterned anti-etching rods 3031 can be a regular array.

Figure 3E:
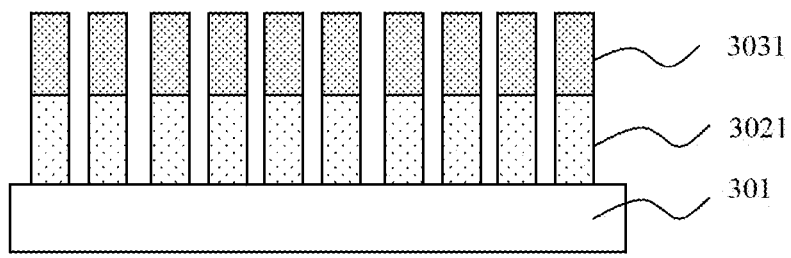
Figure 3F:
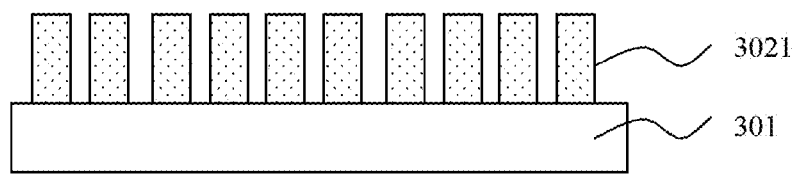

As FIGS. 3E-3F show, the nanoscale metal particles 3041 is removed by an aqueous solution of at least one of $H_2SO_4$, $H_3PO_4$, $H_2C_2O_4$, HCl, KOH, and NaOH, ethylene glycol solution, or their mixture in 80-150° C. Following, another etching process is performed. In the etching process, the plurality of the patterned anti-etching rods 3031 is used as a mask for etching the first semiconductor layer 302. The etching process can be an anisotropic etching like inductively-coupled plasma reactive ion etching (ICP-RIE) to etch the exposed first semiconductor layer 302 and formed a plurality of the first semiconductor rods 3021. Finally, the plurality of the patterned anti-etching rods 3031 is removed.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device, comprising:
a substrate having a first surface and a normal direction perpendicular to the first surface;
a first semiconductor formed on the first surface of the substrate, comprising a plurality of hollow components formed in the first semiconductor layer;
a first protection layer formed on a sidewall and a bottom wall of the plurality of the hollow components, and the bottom wall comprises a portion of the first surface; and
a buffer layer formed on the first semiconductor layer wherein the buffer layer comprises a first surface and a second surface opposite to the first surface.

2. The optoelectronic device of claim 1, wherein two of the hollow components link into a mesh.

3. The optoelectronic device of claim 2, wherein the plurality of the hollow components is formed as a regular array and an average distance between any two of the hollow components is 10 nm-1.5 μm and the porosity of the hollow components is 5-90%.

4. The optoelectronic device of claim 1, further comprising a second semiconductor layer, an active layer, and a third semiconductor layer formed on the second surface of the buffer layer.

5. The optoelectronic device of claim 4, wherein the material of the first semiconductor layer, the second semiconductor layer, the active layer, or the third semiconductor layer contains at least one element selected from the group consisting of Al, Ga, In, As, P, and N.

6. The optoelectronic device of claim 1, wherein the buffer layer comprises an unintentional doped layer, an undoped layer, or an n-type doped layer.

7. The optoelectronic device of claim 1, wherein the material of the first protection layer comprises SiO2, HSQ (Hydrogen silesquioxane), MSQ (Methylsequioxane), and Polymer of silsequioxane.

8. A method of fabricating an optoelectronic device, comprising:
providing a substrate having a first surface and a normal direction perpendicular to the first surface;
forming a first semiconductor layer on the first surface of the substrate;
forming a plurality of hollow components by patterning the first semiconductor layer;
providing a first protection layer to cover a sidewall of the plurality of the hollow components; and
forming a buffer layer on the first semiconductor layer wherein the buffer layer comprise a first surface and a second surface opposite to the first surface;
wherein the method of patterning the first semiconductor layer comprises:
forming an anti-etching layer on the first semiconductor layer;
forming a thin-film metal layer on the anti-etching layer;
forming a plurality of nanoscale metal particles by treating the thin-film metal layer with thermal treatment;
using the plurality of nanoscale metal particles as a mask to pattern the anti-etching layer by anisotropic etching method;
removing the plurality of nanoscale metal particles; and
using the patterned anti-etching layer as a mask to anisotropically etch the first semiconductor layer.

9. The method of fabricating an optoelectronic device of claim 8, wherein two of the hollow components can link into a mesh or porous structure.

10. The method of fabricating an optoelectronic device of claim 8, wherein the plurality of the hollow components is formed as a regular array and an average distance between any two of the hollow components is 10 nm-1.5 μm and the porosity of the hollow components is 5-90%.

11. The method of fabricating an optoelectronic device of claim 8, further comprising a second semiconductor layer, an active layer, and a third semiconductor layer formed on the second surface of the buffer layer.

12. The method of fabricating an optoelectronic device of claim 11, wherein the material of the first semiconductor layer, second semiconductor layer, the active layer, or the third semiconductor layer contains at least one element selected from the group consisting of Al, Ga, In, As, P, and N.

13. The method of fabricating an optoelectronic device of claim 8, wherein the buffer layer comprises an unintentional doped layer, an undoped layer, or an n-type doped layer.

14. The method of fabricating an optoelectronic device of claim 8, wherein the first protection layer is formed by the method of spin on glass coating.

15. The method of fabricating an optoelectronic device of claim 8, wherein the material of the first protection layer comprises SiO2, HSQ (Hydrogen silesquioxane), MSQ (Methylsequioxane), and Polymer of silsequioxane.

16. The optoelectronic device of claim 1, wherein the plurality of hollow components is sandwiched between the first surface of the substrate and the first surface of the buffer layer.

17. The method of fabricating an optoelectronic device of claim 8, wherein the plurality of hollow components is sandwiched between the first surface of the substrate and the first surface of the buffer layer.

18. The optoelectronic device of claim 1, wherein two of the hollow components link into a porous structure.

* * * * *